US 9,207,284 B2

(12) United States Patent
Baba et al.

(10) Patent No.: US 9,207,284 B2
(45) Date of Patent: Dec. 8, 2015

(54) PARAMETER ESTIMATION DEVICE

(75) Inventors: Atsushi Baba, Saitama (JP); Kensuke Osamura, Saitama (JP); Shuichi Adachi, Yokohama (JP)

(73) Assignees: CALSONIC KANSEI CORPORATION, Saitama (JP); KEIO UNIVERSITY, Tokyo (JP)

( * ) Notice: Subject to any disclaimer, the term of this patent is extended or adjusted under 35 U.S.C. 154(b) by 344 days.

(21) Appl. No.: 13/821,573

(22) PCT Filed: Jul. 8, 2011

(86) PCT No.: PCT/JP2011/065660
§ 371 (c)(1),
(2), (4) Date: Mar. 21, 2013

(87) PCT Pub. No.: WO2012/032843
PCT Pub. Date: Mar. 15, 2012

(65) Prior Publication Data
US 2013/0169281 A1    Jul. 4, 2013

(30) Foreign Application Priority Data
Sep. 9, 2010   (JP) ................................. 2010-201968

(51) Int. Cl.
*G01N 27/416* (2006.01)
*G01R 31/36* (2006.01)

(52) U.S. Cl.
CPC ........ *G01R 31/3606* (2013.01); *G01R 31/3624* (2013.01); *G01R 31/3651* (2013.01)

(58) Field of Classification Search
USPC ....................................................... 324/426
See application file for complete search history.

(56) References Cited

U.S. PATENT DOCUMENTS

2009/0051364 A1 *  2/2009 Ishida et al. .................. 324/430

FOREIGN PATENT DOCUMENTS

| JP | 2003-185719 | 7/2003 |
|----|----|----|
| JP | 2007-240521 | 9/2007 |
| JP | 2010-169609 | 8/2010 |

OTHER PUBLICATIONS

International Search Report issued Oct. 4, 2011 in International (PCT) Application No. PCT/JP2011/065660.

* cited by examiner

*Primary Examiner* — Samuel Berhanu
(74) *Attorney, Agent, or Firm* — Wenderoth, Lind & Ponack, L.L.P.

(57) ABSTRACT

A parameter estimation device includes an input signal detecting means 3 that detects an input signal inputted to an object system 1 expressed by an equivalent circuit model 5A containing at least an integrator element $C_{OCV}$, an output signal detecting means 2 that detects an output signal outputted from the object system, an output differentiating means 4 that differentiates the output signal to obtain and output an output differential signal, a modified equivalent circuit model 5B where respective elements of the equivalent circuit model 5A are changed to non-integrator elements in such a way that the output when the input signal is inputted becomes an output differential signal, and an element parameter estimating means 5 that estimates the parameters corresponding to the respective elements based on the modified equivalent circuit model by using the signals.

9 Claims, 6 Drawing Sheets

PARAMETER ESTIMATION DEVICE

TECHNICAL FIELD

The present invention relates to a parameter estimation device which estimates the parameters used in an equivalent circuit model of a secondary battery and the like.

BACKGROUND OF THE INVENTION

Secondary batteries are used in electric vehicles and hybrid electric vehicles, for example, to supply their electric motors for driving the vehicles with electric power (electric discharge) and to store the electric energy obtained from the electric motors functioning as a generator that changes brake energy into the electric power, or to charge the electric energy that is supplied from power source equipment on the ground.

In this case, in order to maintain the states of the secondary batteries to be optimal over the long term, it is needed to always monitor the states of the batteries, especially the states of charge (SoC) thereof and thereby carry out battery management.
The states of the batteries, however, cannot be directly estimated when the batteries are secondary batteries because the discharge and the charge occur under chemical action. In this case, the temperature change affects strongly on the states of the batteries, which always change in their usage environment and according to the usage history.
On the other hand, the capacitors are known as another means to obtain the action similar to that of the batteries. In the capacitors, the states thereof can be almost certainly detected by the measurement of the discharge and charge current, the terminal voltage and so on, because the discharge and charge of the capacitors occur under physical action. The capacities of the capacitors are, however, smaller than those of the batteries, and accordingly the secondary batteries used overwhelmingly as a main power source of the vehicles except a part of trolleybuses and the likes.
Therefore, various methods for estimating the states of charge of the secondary batteries have been proposed.

As the conventional means for estimating the state of charge of the secondary battery, a bookkeeping method (namely a current integration method, or a Coulomb counting method) is known. In this method, the output and input voltage and current of the battery are stored in the form of time-series data, and the current is time-integrated to obtain present the electric charge based on the data, and then the SoC is computed by using the initial charge of the battery and its full charge capacity.
The method, however, needs to always monitor the state of the battery, and it is difficult to become normal again once the estimation of the SoC deviates because the errors keep on being accumulated. In addition, it is necessary to gather a lot of experiment data in advance.
Therefore, the other method is proposed.

Another method is known, where the discharge and charge current and the terminal voltage of the secondary battery is measured, and all of the coefficient parameters are estimated together from the current and the terminal current based on a battery model of the secondary battery by using a parameter estimating device containing an adaptive digital filter. Then the open-circuit voltage is computed from the estimated results, and the state of the battery is estimated based on a relationship, which is obtained in advance, between the open-circuit voltage and the stage of battery.

PRIOR ART DOCUMENT

Patent Document

Patent Document 1: Japanese Patent Application publication No. 2003-185719

DISCLOSURE OF THE INVENTION

Problem(s) to be Solved by the Invention

Such a conventional parameter-of-the-secondary-battery estimation device has a problem described below.
FIG. 6 shows a function block diagram of the conventional parameter-of-the-secondary-battery estimation device.
It includes a terminal voltage detection part 101, a discharge-and-charge current detection part 102, a parameter estimation part 103, an open-circuit calculation part 104 and a state-of-charge calculation part 105. The terminal voltage detection part 101 detects the terminal voltage $v_t$ of a not-shown secondary battery. The discharge-and-charge current detection part 102 detects the discharge and charge current i. The parameter estimation part 103 has an equivalent circuit model containing a resistance and a capacitor corresponding to a battery model of the secondary battery to calculate coefficients of an state equation expressing the battery model by using the terminal voltage $v_t$ and the discharge and charge current i. The open-circuit calculation part 104 calculates the open-circuit voltage $C_{OCV}$ based on the parameters obtained by the parameter estimation part 103 and the discharge and charge current i obtained by discharge-and-charge current detection part 102. The state-of-charge calculation part 105 calculates the state of battery (SoC) based on the open-circuit voltage $C_{OCV}$ obtained by the open-circuit calculation part 104.

Various kinds of battery models have been proposed. The equivalent circuit models of the battery model generally include a capacitor as well as the above-described prior art, where the capacitor functions as an integrator element. Thus, in a case where the integrator element is used in the equivalent circuit model, it deteriorates the degree of the accuracy in the estimation of the parameters used in the equivalent circuit model without input signal with low frequency signal that is close to direct current.
This reason will be explained below by using the equivalent circuit model of the secondary battery, which is used in the present invention, shown in FIG. 7. Incidentally, the equivalent circuit model shown in FIG. 7 is a little bit different from that of the prior art, but they have the similar problems because they have the integrator element.

The equivalent circuit model of the secondary battery shown in FIG. 7 employs a Forster type RC ladder circuit (only one stage). In other words, the circuit has a bulk resistance $R_0$ and a parallel circuit connected to the bulk resistance $R_0$ and consisting of a resistance $R_1$ and a capacitor $C_1$. The bulk resistance $R_0$ sets a direct-current component of ohm's resistance of wire connection and electrolyte resistance, the resistance $R_1$ sets the reaction resistance expressing dynamic behavior in a charge-transfer process and corresponding to the Faraday impedance, and the capacitor $C_1$ sets the electric double layer corresponding to non-faradic impedance.
In addition, in FIG. 7, OCV indicates the open-circuit voltage of the capacitor $C_{OCV}$, $v_1$ indicates the overvoltage generated in the parallel circuit, and i indicates the current (input). The terminal voltage $v_t$ is equal to the sum of the open-circuit voltage OCV and the overvoltage $v_1$.

The above equivalent circuit model is expressed by the following continuous-time transfer function.

$$V(s) = \frac{b'_0 s^2 + b'_1 s + b'_2}{s^2 + a'_0 s} I(s) \qquad \text{(Eq. 1)}$$

where s is the Laplace operator, and the coefficients are expressed by the following equations.

$$\begin{cases} a'_0 = \dfrac{1}{R_1 C_1} \\ b'_0 = R_0 \\ b'_1 = \dfrac{1}{C_{ocv}} + \dfrac{R_0}{R_1 C_1} + \dfrac{1}{C_1} \\ b'_2 = \dfrac{1}{R_1 C_1 C_{ocv}} \end{cases} \qquad \text{(Eq. 2)}$$

Herein, the equation of Eq. 1 of the continuous system is discretized by using the Bilinear transform (also known as Tustin's method) to obtain the following equations.

$$V(z) = \frac{b_0 z^2 + b_1 z + b_2}{z^2 + a_1 z + a_2} I(z) \qquad \text{(Eq. 3)}$$

Herein, in the equation of Eq. 2, the coefficients are as follows.

$$\begin{cases} a_1 = \dfrac{-4}{2 + a'_0 T_s} \\ a_2 = \dfrac{2 - a'_0 T_s}{2 + a'_0 T_s} \\ b_0 = \dfrac{4b'_0 + 2b'_1 T_s + b'_2 T_s^2}{2(2 + a'_0 T_s)} \\ b_1 = \dfrac{-4b'_0 + b'_2 T_s^2}{2 + a'_0 T_s} \\ b_2 = \dfrac{4b'_0 - 2b'_1 T_s + b'_2 T_s^2}{2(2 + a'_0 T_s)} \end{cases} \qquad \text{(EQ. 4)}$$

Incidentally, let $T_s$ to be the sampling interval, the following equation is obtained in the Bilinear transform, $$s = \frac{2}{T_s} \frac{z-1}{z+1} \qquad \text{(Eq. 5)}$$

From the equation Eq. 2, the following equation is obtained.

$$\begin{bmatrix} v_k = -a_1 v_{k-1} - a_2 v_{k-2} + b_0 i_k + b_1 i_{k-1} + b_2 i_{k-2} \\ v_k = [-a_1 \ -a_2 \ b_0 \ b_1 b_2] \begin{bmatrix} v_{k-1} & v_{k-2} & i_k \\ i_{k-1} & i_{k-2} \end{bmatrix}^T = \theta^T \varphi_k \end{bmatrix} \qquad \text{(Eq. 6)}$$

Herein, the additional character k is the order number of the sampling (time step), $v_k$ is the k-th terminal voltage, $i_k$ is the k-th current, the upper additional character T means the transpose of a matrix, θ is a coefficient matrix explaining a model, and φ is a data matrix.

The five coefficients ($a_1$, $a_2$, $b_0$, $b_1$, $b_2$) are system-identified based on the current i and the voltage $v_t$ by using the equation of Eq. 3. The four parameters ($R_0$, $R_1$, $C_1$, $C_{OCV}$) are computed based on the five coefficients obtained by the system identification. In this computation, if the number of conditional equations (coefficients) is five, conflicting results may be caused to have two different solutions because it is larger than four that is the number of the unknown parameters.

In such a case, one of them is used.

The above-described model contains the integrator element. In such a model, it is generally known that the estimation accuracy deteriorates theoretically without a low-frequency-wave input signal with intensity to some degree.

That is, in the prior art, when a step input current i, as an example of extreme-low-frequency-wave current as shown in FIG. 8, is inputted, the voltage v rises up and diverges over time as shown a lower half part of FIG. 8. The inclination at this time is $1/C_{OCV}$, and accordingly $C_{OCV}$ can be calculated from the inverse number of the inclination. Therefore, the estimation accuracy deteriorates when no current with such a low frequency wave is inputted, because the proper inclination of the change of the terminal voltage cannot be obtained.

When such a model is applied to the electric vehicles and the likes, the current wave form of the electric vehicle is supplied to the electric motor, an air conditioner, an auxiliary machine and others, complicatedly being inputted thereto. In addition, there is noise due to the current sensor that detects the current. As a result, the current has many high-frequency-wave components. When the input is inputted with such a many high-frequency-wave components to the above-described model, its calculation diverges and the estimation becomes impossible in some cases.

The present invention is made to solve the problems, and its object is to provide a parameter estimation device which can suppress deterioration in the estimate accuracy of parameters due to an equivalent circuit model containing an integrator element when it is not inputted with an input signal including a low frequency wave.

Means for Solving the Problems

In order to achieve the above-mentioned object, a parameter estimation device of the first invention includes:
an input-signal detecting means for detecting an input signal inputted to an object system that is capable of being expressed by an equivalent circuit model containing at least an integrator element;
an signal output-signal detecting means for detecting an output signal outputted from the object system;
an output-differentiating means that differentiates the output signal detected by the output-signal detecting means to output an output-differential signal;
a modified equivalent circuit model of the object system in which each element of the equivalent circuit model is changed into non-integrator element in such a way that the output signal is obtained as the output-differentiating signal when the input signal is inputted from the input-signal detecting means; and
an element parameter estimating means for estimating parameters corresponding to respective elements of the modified equivalent circuit model based on the modified equivalent circuit model by receiving and using the output differential signal and the input signal that are inputted to the modified equivalent circuit model.

Incidentally, the terms "differential" and "differentiating" include "delta" and "calculating a finite difference", respectively.

A parameter-of-the-secondary-battery estimation device of the second invention includes:
a discharge-and-charge current detecting means for detecting discharge current and charge current of a secondary battery that is capable of being expressed by using an equivalent circuit model containing at least an integrator element;
a terminal-voltage detecting means for detecting terminal voltage of the secondary battery;
a voltage differentiating means for differentiating the terminal voltage detected by the terminal voltage detecting means to output a voltage-differential signal;
a modified equivalent circuit model of the secondary battery in which each element of the equivalent circuit model is changed into a non-integrator element in such a way that the output signal obtained is obtained as the voltage differential signal when the discharge and charge current is inputted from the discharge-and-charge current detecting means; and
an element parameter estimating means for estimating parameters corresponding to respective elements of the modified equivalent circuit model based on the modified equivalent circuit model by receiving and using the voltage differential signal and the discharge and charge current that are inputted to the modified equivalent circuit model.

Incidentally, the terms "differential" and "differentiating" include "delta" and "calculating a finite differences", respectively.

Effect of the Invention

In the parameter estimation device of the first invention, the parameters of the respective elements of the modified equivalent circuit model are calculated by using the modified equivalent circuit model, in which the output becomes to be the output differential and the respective elements become the non-integrator elements, and inputting the input signal and the output differential signal to the modified equivalent circuit model when the equivalent circuit model of the object system contains the integrator element. Therefore, it can suppress the deterioration in the estimate accuracy of the parameters due to the integrator element when no input signal with the low frequency wave is inputted.

In the parameter-of-the-secondary-battery estimation device of the second invention, the parameters of the modified equivalent circuit model are calculated by using the modified equivalent circuit model, in which the output becomes the voltage differential and the respective elements of the modified equivalent circuit model become the non-integrator elements when the equivalent circuit model of the secondary battery contains the integrator element. Therefore, it can suppress the deterioration in the estimate accuracy of the parameters of the battery model due to the integrator element when no input signal with the low frequency wave is inputted.

Figure 1:
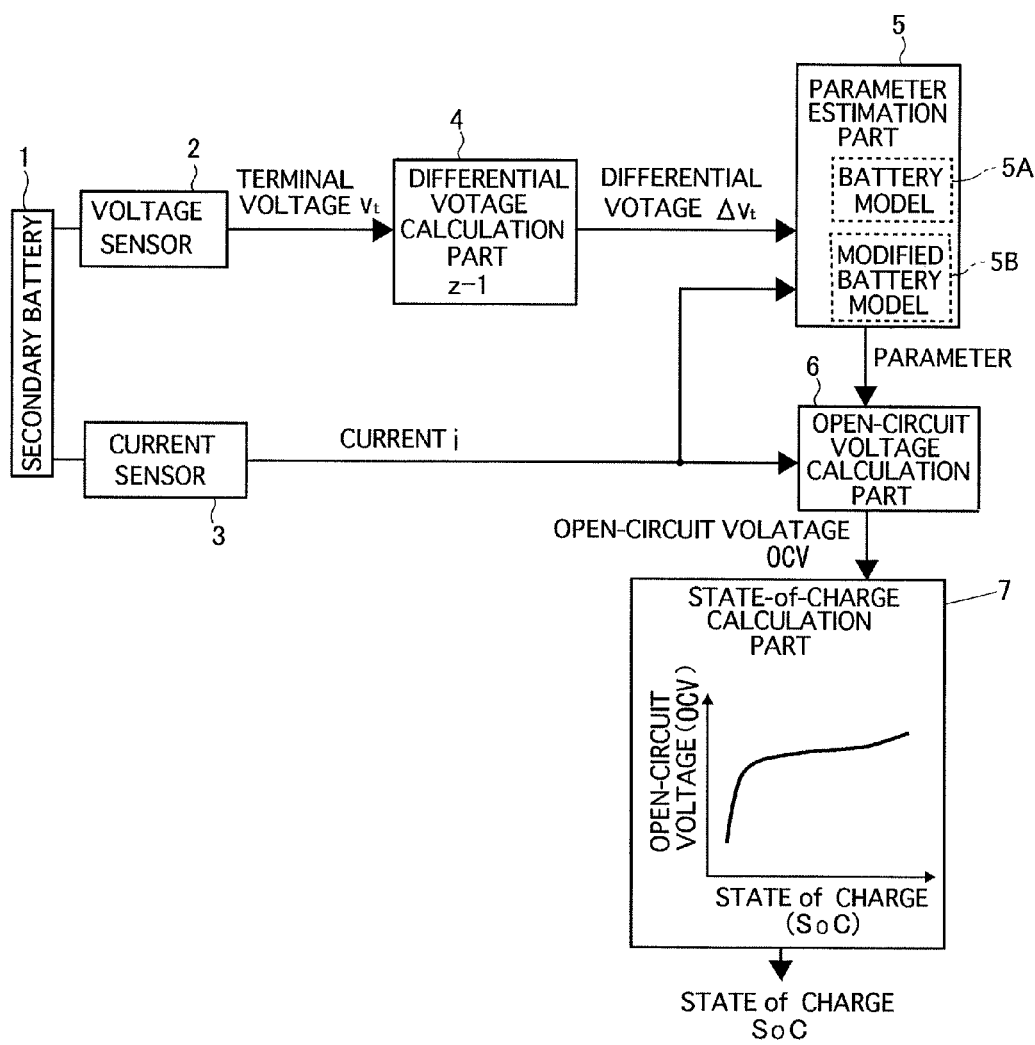
FIG. 1 is a function block diagram showing a device for estimating a state of charge of a secondary battery, the device using a parameter-of-the-secondary-battery estimation device according to a first embodiment of the present invention.

DESCRIPTION OF REFERENCE NUMBERS 1 secondary battery
2 voltage sensor (terminal voltage detecting means)
3 current sensor (discharge-and-charge current detecting means)
4 differential voltage calculation part (differential voltage calculating means)
5 parameter estimation part
5A battery model (equivalent circuit model)
5B modified battery model
6 open circuit voltage calculation part
7 state-of-charge calculation part

BEST MODE FOR CARRYING OUT THE INVENTION

Hereinafter, a mode for carrying out the invention will be in detail explained based on an embodiment with reference to the drawings.

Embodiment 1

A parameter-of-a-secondary-battery estimation device according to the first embodiment is used in electric vehicles, hybrid electric vehicles and others. Such a vehicle is provided with a not-shown electric motor for driving the vehicle, a secondary battery 2, and a not-shown controller to control them. The electric power is supplied (discharged) from the battery 1 to the electric motor when the vehicle is driven, while the electric motor functions as a generator to change brake energy into the electric power when the vehicle is being braked to accumulate (charge) it in the battery 1. The battery 1 is also charged from power source equipment provided on the ground.
The state-of-charge estimation device monitors the discharge and charge current of the battery 1, thereby estimating the state of charge as one of the states of the battery 1.

First, an entire construction of the parameter-of-the-secondary-battery estimation device of the first embodiment will be described.

As shown in FIG. 1, the parameter-of-the-secondary-battery estimation device of the first embodiment is electrically connected with the secondary battery 1, and it has a voltage sensor 2, a current sensor 3, a differential voltage calculation part 4, a parameter estimation part 5, an open-circuit voltage estimation part 6 and a state-of-charge calculation part 7. Incidentally, the differential voltage calculation part 4, the parameter estimation part 5, the open-circuit voltage estimation part 6 and the state-of-charge calculation part 7 are constructed by a microcomputer on board.

The secondary battery 1 employs a lithium-ion battery, which is not limited, it may employ other kind of batteries such as a nickel metal-hydrate battery. The secondary battery corresponds to an object system of the present invention.

The voltage sensor 2 detects the value of voltage between the terminals of the battery 1, inputting the terminal voltage to the parameter estimation part 5 through the differential voltage calculation part 4.

The current sensor 2 detects the value of discharge current that is supplied from the battery 1 to the electric motor and others, and the value of charge current regenerated from a part of brake energy by the motor functioning as the generator and outputted from the power source equipment on the ground. The detected discharge and charge current is inputted as the input signal to the parameter estimation part 5 and the open-circuit voltage calculation part 6.

Incidentally, the voltage sensor 2 and the current sensor 3 may appropriately employ various constructions and various types. The voltage sensor 2 corresponds to a terminal voltage detecting means and an output signal detecting means of the present inventions, and the current sensor 3 corresponds to a discharge-and-charge current detecting means and an input signal detecting means of the present inventions. The discharge and charge current corresponds to an input signal of the present invention, and the terminal voltage corresponds to an output signal of the present invention.

The differential voltage calculation part 4 differentiates the terminal voltage v that is inputted from the voltage sensor 2, where the terminal voltage is multiplied by z−1 (z means z-transformation) to obtain a differential voltage Δv, inputting this value to the parameter estimation part 5. Incidentally, the differential voltage calculation part 4 corresponds to an output differentiating means and a voltage differentiating means of the present inventions, and the differential voltage Δv corresponds to an output differential signal and a voltage differentiating signal of the present inventions.

The parameter estimation part 5 has a battery model 5A, which will be later described, being inputted with the voltage differential Δv and the current i detected by the current sensor 3, and then estimating the parameters based on the battery model 5A. This detail will be later described. Incidentally, the parameter estimation part 5 corresponds to an element parameter calculating means of the present invention.

The open-circuit voltage calculation part 6 is inputted with the parameters estimated by the parameter estimation part 5 and the current i detected by the current sensor 3 to estimate an open-circuit voltage. The open-circuit voltage is inputted to the state-of-charge calculation part 7. Incidentally, the open-circuit voltage calculation part 6 corresponds to an open-circuit voltage calculating means of the present invention.

The state-of-charge calculation part 7 stores the results of a relationship between the open-circuit voltage (OCV) and the state of charge (SoC), which are previously obtained through experiments and so on, in a data table, where the relationship therebetween is hardly affected by the temperature and the degradation of the battery. The state of charge (SoC) of the battery is estimated based on the estimated open-circuit voltage OCV^ that is estimated by the open-circuit voltage estimation part 6. Incidentally, the state-of-charge calculation part 7 corresponds to a state-of-charge calculating means of the present invention.

Next, the battery model used in the parameter estimation part 5 will be described.

Figure 7:
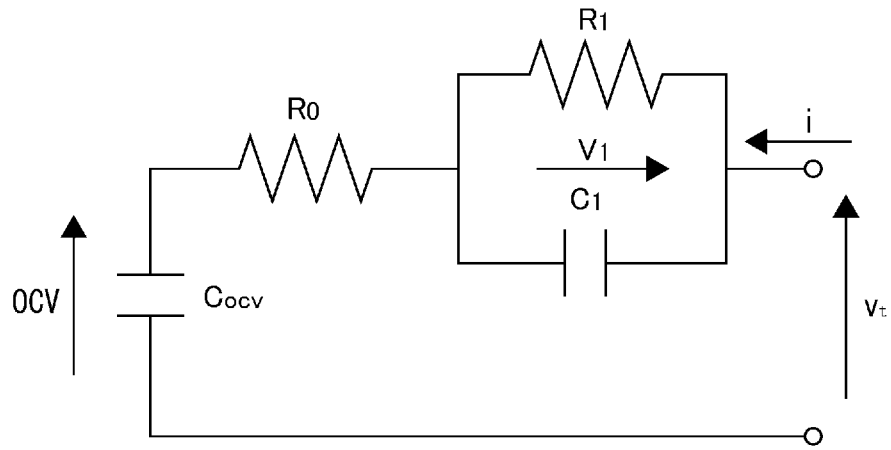
FIG. 7 is a circuit diagram showing a battery model that is used in the parameter-of-the-secondary-battery estimation device shown in FIG. 6.
Figure 8:
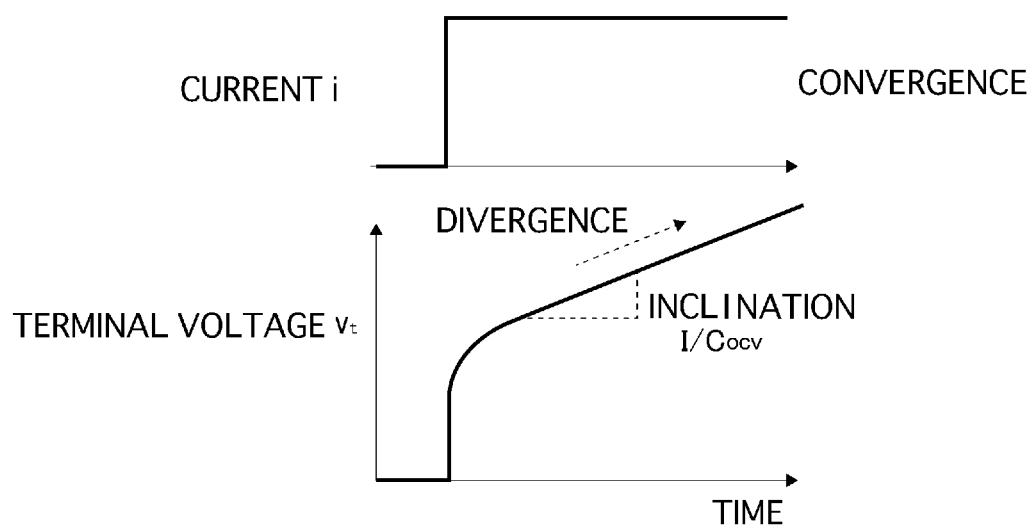
FIG. 8 is a diagram showing a response obtained when a step-input current is inputted to the battery model shown in FIG. 7.

In the first embodiment, instead of the terminal voltage in the conventional model shown in FIG. 7, the differential voltage, which is obtained by differentiating the terminal voltage in advance at the differential voltage calculation part 4, is used as a new output of the battery model, because the estimation accuracy of the parameters becomes worse when there is no input including a low frequency wave that is inputted to the battery model. Incidentally, the input current is not changed or modified.

Figure 2:
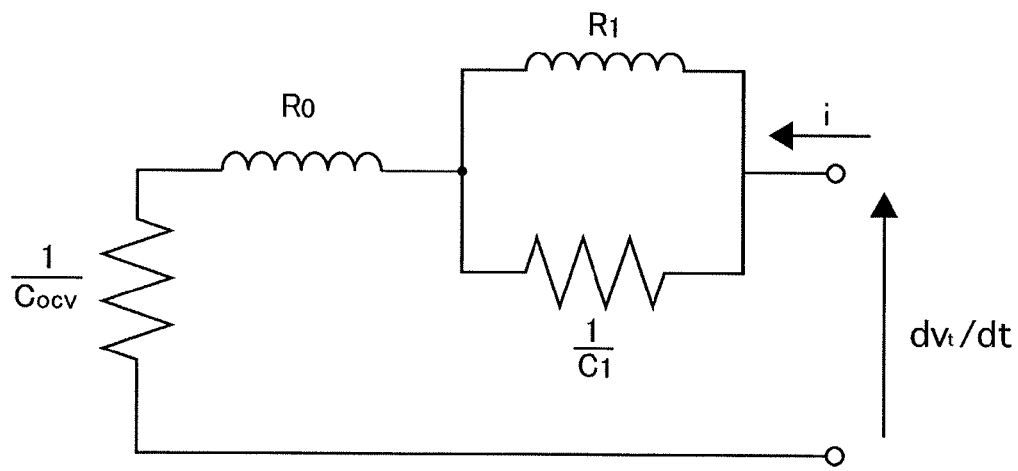
FIG. 2 is a circuit diagram showing a battery model that is used in a parameter estimation part of the first embodiment.

The battery model 5A (corresponding to an equivalent circuit model of the present invention) is changed from the conventional battery model consisting of capacitors $C_{OCV}$, $C_1$ and resistances $R_0$, $R_1$ to the modified battery model 5B (corresponding to a modified equivalent circuit model) shown in FIG. 2.

In other words, in FIG. 2, the capacitors $C_{OCV}$, $C_1$ shown in FIG. 7 are respectively changed to resistances $1/C_{OCV}$, $1/C_1$, and the resistances $R_0$, $R_1$ shown in FIG. 7 are respectively changed to the coils $R_0$, $R_1$.

This model is expressed by the following equation, using the equation of Eq. 7 instead of the equation of Eq. 1.

$$sV(s) = \frac{b'_0 s^2 + b'_1 s + b'_2}{s + a'_0} I(s) \qquad \text{(Eq. 7)}$$

This equation is discretized by using the Bilinear transform to obtain Eq. 8.

$$(z-1)V(z) = \frac{b_0 z^2 + b_1 z + b_2}{z - a_2} I(z) \qquad \text{(Eq. 8)}$$

where, the coefficients $a_2$, $b_0$, $b_1$, $b_2$ are the same ones explained in the prior art.

From this equation, the following equation is obtained.

$$v_k - v_{k-1} = a_2(v_{k-1} - v_{k-2}) + b_0 i_k + b_1 i_{k-1} + b_2 i_{k-2}$$

$$\Delta v_k = [a_2 b_0 b_1 b_2][\Delta v_{k-1} i_k i_{k-1} i_{k-2}]^T = \theta^T \phi_k \qquad \text{<Eq. 9>}$$

where, additional character k is the number of sampling order, $v_k$ is the terminal voltage as the k-th input, ΔVk is the differential voltage (finite difference) of the k-th terminal voltage, θ is the coefficient matrix describing the modified equivalent circuit model, φ is the data matrix, and the additional character T means transpose of the matrix (vector).

Using the above equations, the four circuit parameters $R_0$, $R_1$, $C_1$, $C_{OCV}$ are obtained from the four coefficients $a_2$, $b_0$, $b_1$, $b_2$ of transfer function estimated by using the system identification. In this case, the calculation is carried out, using four conditional expressions (coefficients) and four unknown parameters. This always provides a unique solution, and the symbolic calculation is available by using a computer.

Figure 3:
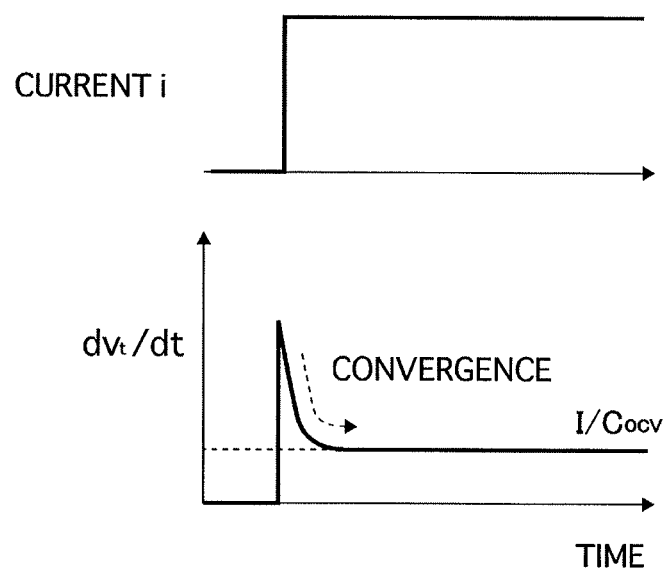
FIG. 3 is a diagram showing a response when step-input current is inputted to the battery model shown in FIG. 2.

The lower half part of FIG. 3 shows a response when the modified battery model 5B (the modified equivalent circuit model) shown in FIG. 2 is inputted with the step-input current shown in the upper half part of FIG. 3. In this case, the differential (the infinite difference $dv_t/dt$) of the terminal voltage $v_t$ rises up to a certain value, and then it suddenly falls down to converge to a certain constant value. That is, in the method of the embodiment, it is not necessary to input the current with the low frequency wave because the inclination at diversion is not necessary like the problem of the prior art.

In the parameter-of-the-secondary-battery estimation device according to the first embodiment, where the battery model 5B is modified from the battery model 5A as described above, the differential voltage calculation part 4 subtracts the previous terminal voltage $v_{k-1}$ from the obtained terminal voltage $v_k$ to obtain the differential voltage $\Delta v_k$. The differential voltage $\Delta v_k$ and the discharge and charge current i obtained from the current sensor 3 are inputted to the parameter estimation part 5, which estimates the parameters by using the recursive least squares technique for example.

The parameter estimation part 5 is expressed as the following equation since it uses the battery model shown in FIG. 2.

$$sV(s) = \frac{b'_0 s^2 + b'_1 s + b'_2}{s + a'_0} I(s) \quad \langle \text{Eq. 10} \rangle$$

The equation of Eq. 4 is discretized by using the Bilinear transform to obtain the following equation.

$$(z-1)V(z) = \frac{b_0 z^2 + b_1 z + b_2}{z - a_2} I(z) \quad \langle \text{Eq. 11} \rangle$$

Herein, the coefficients are expressed by the following equations.

$$\begin{cases} a_1 = \dfrac{-4}{2 + a'_0 T_s} \\ a_2 = \dfrac{2 - a'_0 T_s}{2 + a'_0 T_s} \\ b_0 = \dfrac{4 b'_0 + 2 b'_1 T_s + b'_2 T_s^2}{2(2 + a'_0 T_s)} \\ b_1 = \dfrac{-4 b'_0 + b'_2 T_s^2}{2 + a'_0 T_s} \\ b_2 = \dfrac{4 b'_0 - 2 b'_1 T_s + b'_2 T_s^2}{2(2 + a'_0 T_s)} \end{cases} \quad \langle \text{Eq. 12} \rangle$$

The Bilinear transform discretizes the equations, using $T_s$ as a sampling interval.

$$s = \frac{2}{T_s} \frac{z-1}{z+1} \quad \langle \text{Eq. 13} \rangle$$

Based on the above equations, the following equation is obtained.

$$v_k - v_{k-1} = a_2(v_{k-1} - v_{k-2}) + b_0 i_k + b_1 i_{k-1} + b_2 i_{k-2}$$

$$\Delta v_k = [a_2 b_0 b_1 b_2][\Delta v_{k-1} i_k i_{k-1} i_{k-2}]^T = \theta^T \phi_k \quad \langle \text{Eq. 14} \rangle$$

The four coefficients $a_2, b_0, b_1, b_2$ are system-identified based on the current i and the terminal voltage v.

Herein, the system identification algorism using the recursive least squares technique, which is most popular, is shown below.

$$\begin{cases} K_k = \dfrac{P_{k-1} \varphi_k}{\varphi_k^T P_{k-1} \varphi_k + 1} \\ \hat{\theta}_k = \hat{\theta}_{k-1} + K_k \left( y_k - \varphi_k^T \hat{\theta}_{k-1} \right) \\ P_k = P_{k-1} - K_k \varphi_k^T P_{k-1} \end{cases} \quad \langle \text{Eq. 15} \rangle$$

where, $K_K$ is a k-th feedback gain, $P_k$ is a k-th covariance matrix, $y_k$ is the k-th output (differential of the terminal voltage), the upper additional character ^ means the estimate value. The algorism is repeatedly calculated, appropriate values $P_0$ and $\theta_0$ being given as the initial values. This identifys the coefficients as the required estimate value $\theta_k$.

The four circuit parameters $R_0, R_1, C_1, C_{OCV}$ are obtained by the calculation based on the four coefficients that are obtained by using the system identification described above. Ultimately, the circuit parameters are obtained as follows.

$$\begin{cases} R_0 = \dfrac{b_0 - b_1 + b_2}{2(1 + a_2)} \\ R_1 = \dfrac{T_s(1 + a_2)}{2(1 - a_2)} \left\{ \dfrac{2(b_0 - b_2) - 2R_0(1 - a_2)}{T_s(1 + a_2)} - \dfrac{b_0 + b_1 + b_2}{T_s(1 + a_2)} \right\} \\ C_1 = \left( \dfrac{2(b_0 - b_2) - 2R_0(1 - a_2)}{T_s(1 + a_2)} - \dfrac{b_0 + b_1 + b_2}{T_s(1 - a_2)} \right)^{-1} \\ C_{ocv} = \dfrac{T_s(1 - a_2)}{b_0 + b_1 + b_2} \end{cases} \quad \langle \text{Eq. 16} \rangle$$

Next, the open-circuit voltage calculation part 6 calculates the open-circuit voltage (OCV) based on the parameters estimated by the parameter estimation part 5 and the current detected by the current sensor 3, using the battery model (equivalent circuit model) shown in FIG. 7.
Herein, $$sOCV = \frac{I}{C_{ocv}} \quad \langle \text{Eq. 17} \rangle$$

The following equation is obtained by the descretization of the equation of Eq. 17.

$$OCV = \frac{1}{C_{ocv}} \frac{T_s}{2} \frac{z+1}{z-1} \quad \langle \text{Eq. 18} \rangle$$

That is, the open-circuit voltage estimate value $OCV_k$ can be obtained from the following equation.

$$OCV_k = OCV_{k-1} + \frac{T_s}{2 C_{ocv}} (i_k + i_{k-1}) \quad \langle \text{Eq. 19} \rangle$$

Thus-estimated open-circuit voltage value is estimated based on the open-circuit voltage estimation value, using the data table in the state-of-charge calculation part 7 which consists of the data on the open-circuit voltage and the state of charge.

Figure 4:
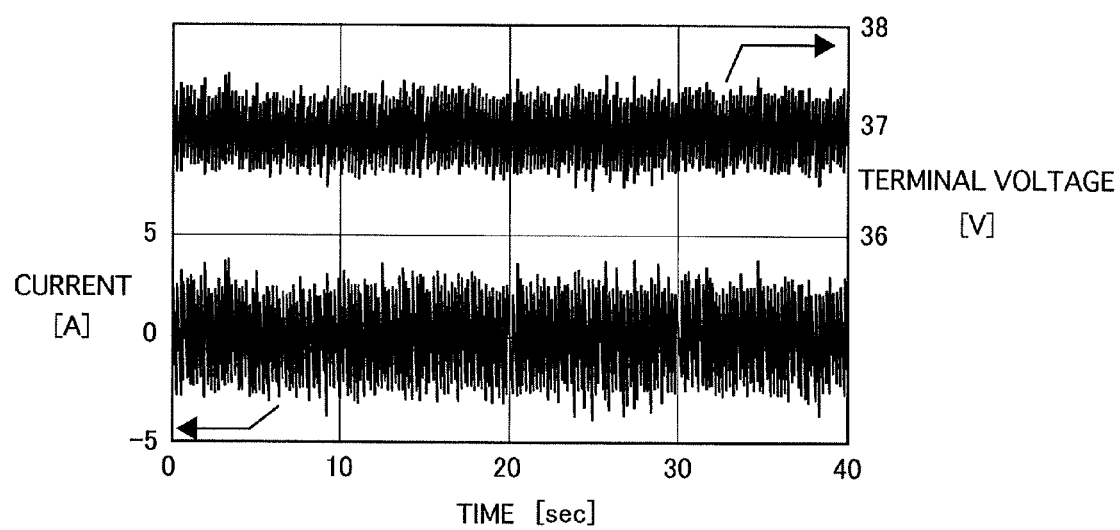
FIG. 4 is a diagram showing current with no low frequency wave components which is inputted to the estimation device to estimate the results of estimated parameters of the battery model obtained from the parameter-of-the-secondary-battery estimation device by simulation.

Next, the simulation results will be shown, where the simulation to estimate the parameters is performed, using the parameter-of-the-secondary-battery estimation device of the first embodiment. The input current employs the current without the low frequency wave as shown in FIG. 4.

Incidentally, the terminal voltage is also shown. In FIG. 4, the horizontal axis indicates time (The unit is second.), the vertical axis indicates the values of the current (The unit is ampere.) and the terminal voltage (The unit is volt.), where the scale marks of the terminal voltage are shown at the right side, while the scale marks of the current are shown at the left side. Such a current generates in the circumstances such that the vehicle runs down a long slope.

Figure 5:
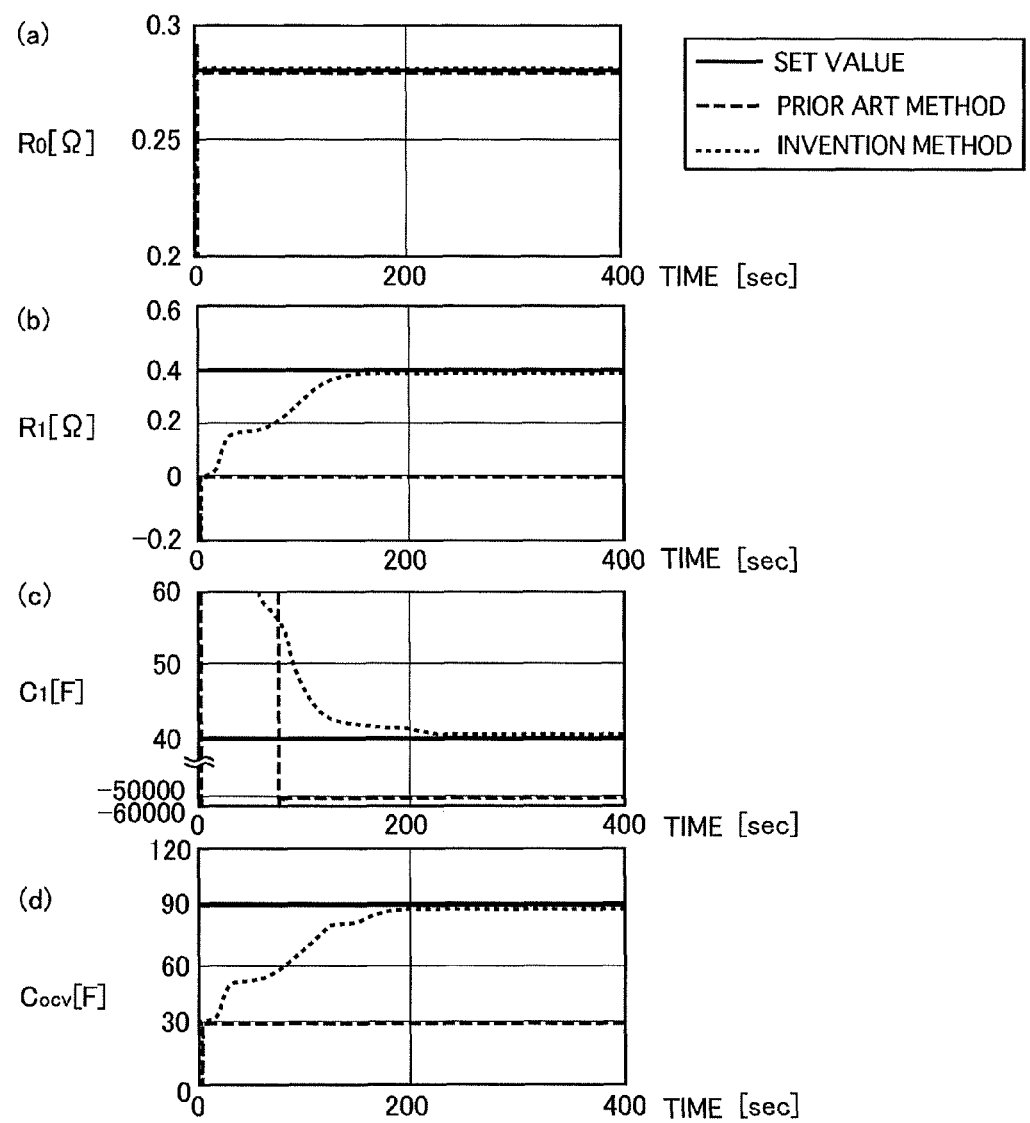
FIG. 5 is a diagram showing the results of the estimated parameters when the current shown in FIG. 4 is inputted to the parameter-of-the secondary-battery estimation device of the first embodiment, where (a) shows the simulation result of the bulk resistance in the battery model shown in FIG. 2, (b) shows the simulation result of Faraday impedance (resistance) in the circuit shown in FIG. 2, (c) shows the simulation result of non-faradic impedance (capacitor) of the circuit shown in FIG. 2, and (d) shows the simulation result of the estimated open circuit voltage.
Figure 6:
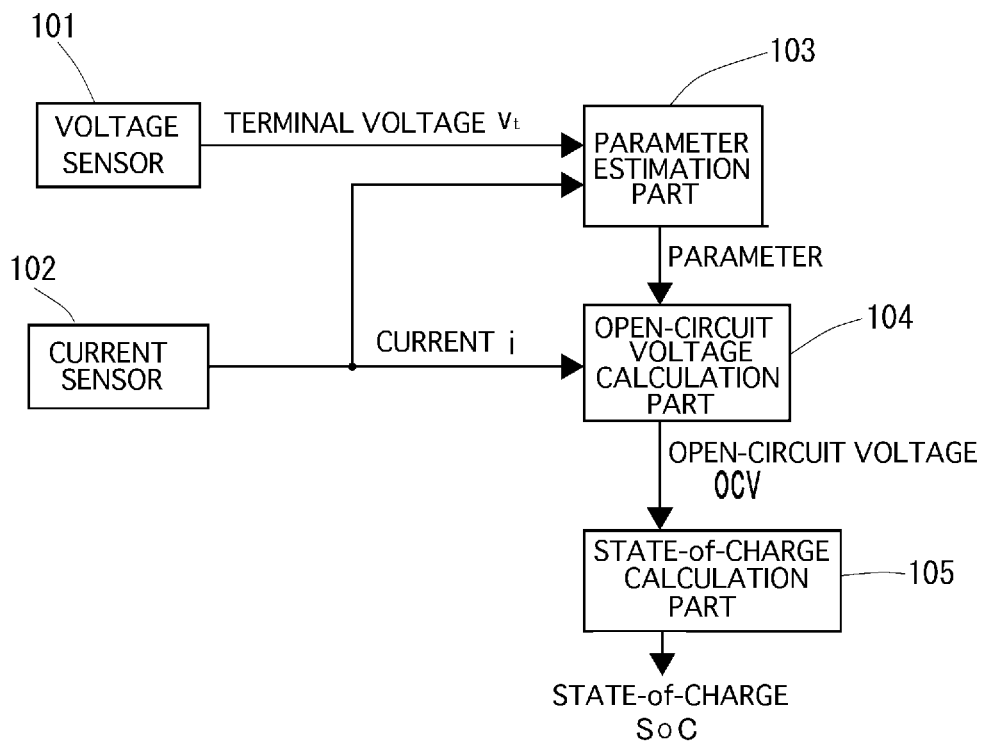
FIG. 6 is a block diagram showing a device for estimating a state of charge of a secondary battery, using a parameter-of-the secondary-battery estimation device according to the prior art.

FIG. 5 shows the results of the parameters $R_0, R_1, C_1, C_{OCV}$ of the battery model which are estimated by the parameter-of-the-secondary-battery estimation device of the first embodiment at that time.

In FIG. 5, the horizontal axis indicates time (The unit is second.), the vertical axis indicates the values of the resistance (The unit is ohm.) and capacitor (The unit is Farad.). In addition, the solid lines indicate the set values, the dashed lines indicate the estimate values estimated by the prior art, and the dotted lines indicates the estimate values estimated by the first embodiment.

As understood from FIG. 5, the coefficients $R_1$, $C_1$, $C_{OCV}$ maintain small values, not approaching to the set values, in the prior art, while they converge to the set values or near the set values in approximately 200 seconds.

That is, the parameters can be well estimated, and accordingly it is understandable that the state of change of the secondary battery 1 can be estimated with high accuracy.

As described above, the parameter-of-the-secondary-battery device and method of the first embodiment can provide the following effects.

(1) In the parameter-of-the secondary-battery device and method of the first embodiment, the differential voltage calculation part 4 calculates the infinite difference (differentiates) of the terminal voltage detected by the voltage sensor 2 in advance, and the parameter estimation part 5 uses the differential of the voltage as a new output to estimate the parameters, because the battery model contains the integrator element, since the battery model contains the integrator element. Therefore, the parameters of the battery model can be estimated with high accuracy even when there is no input current with the low frequency wave.

(2) In addition, in this case, the number of the coefficients of the circuit model is decreased from five to four, which becomes the same number as that of the unknown parameters. Therefore, the parameter estimation device and method of the first embodiment can smoothly carry out its process because it can overcome the contradiction such that two kind of solutions are obtained, providing only unambiguous solution.

(3) Further, the open-circuit voltage calculation part 6 calculates the open-circuit voltage estimate value by using the parameters estimated by the parameter estimation part 5, and then the state of charge of the secondary battery 1 is estimated based on the open-circuit voltage estimate value. Therefore, the state of charge can be estimated with high accuracy.

While the present invention has been explained based on the embodiment, the present invention is not limited to the embodiment, and it covers all such design changes and modifications as long as they do not deviate from the subject of the invention.

For example, the parameter estimation part 5 uses the recursive least squares technique algorism, which is not limed. It may use an adaptive digital filter or a Kalman filter for example.

INDUSTRIAL APPLICABILITY

The object of the parameter-of-the battery estimation device of the present invention is not limited to the lithium-ion battery, while it may be the other kind of secondary batteries. In addition, the estimation of the state of charge of the battery according to the present invention can be used not only for the batteries of the electric vehicles and the hybrid electric vehicles, but also for the batteries provided on the ground or structural objects.

The invention claimed is:

1. A parameter estimation device comprising:
    an input-signal detecting means for detecting an input signal inputted to an object system that is capable of being expressed by an equivalent circuit model containing at least an integrator element;
    an output-signal detecting means for detecting an output signal outputted from the object system;
    an output differentiating means that differentiates the output signal detected by the output-signal detecting means to output an output differential signal;
    a modified equivalent circuit model of the object system in which each element of the equivalent circuit model is changed into non-integrator element in such a way that the output signal obtained when the input signal outputted from the input-signal detecting means becomes to be the output differential signal; and
    an element parameter estimating means for estimating parameters corresponding to respective elements of the modified equivalent circuit model based on the modified equivalent circuit model by receiving and using the output differential signal and the input signal that are inputted to the modified equivalent circuit model.

2. A parameter-of-secondary-battery estimation device comprising:
    a discharge-and-charge current detecting means for detecting discharge current and charge current of a secondary battery that is capable of being expressed by using an equivalent circuit model containing at least an integrator element;
    a terminal voltage detecting means for detecting terminal voltage of the secondary battery;
    a voltage differentiating means for differentiating the terminal voltage detected by the terminal voltage detecting means to output a voltage differential signal;
    a modified equivalent circuit model of the secondary battery in which each element of the equivalent circuit model is changed into a non-integrator element in such a way that the output signal obtained when the discharge and charge current is inputted from the discharge-and-charge current detecting means becomes to be the voltage differential signal; and
    an element parameter estimating means for estimating parameters corresponding to respective elements of the modified equivalent circuit model based on the modified equivalent circuit model by receiving and using the voltage differential signal and the discharge and charge current that are inputted to the modified equivalent circuit model.

3. The parameter-of-secondary-battery estimation device according to claim 2, further comprising:
    an open-circuit voltage estimating means that estimates an open-circuit voltage of the secondary battery based on the equivalent circuit model of the secondary battery by using the parameters estimated by the element parameter estimating means and the discharge and charge current.

4. The parameter-of-secondary-battery estimation device according to claim 3, further comprising:

a state-of-charge calculating means that has data on the open-circuit voltage and a state of charge of the secondary battery, wherein the state-of-charge calculating means calculates the state of charge of the secondary battery based on the data by using the open-circuit voltage estimated by the open-circuit voltage estimating means.

5. The parameter-of-secondary-battery estimation device according to claim 4, wherein the integrator element comprises a capacitor.

6. The parameter-of-secondary-battery estimation device according to claim 2, wherein the integrator element comprises a capacitor.

7. The parameter-of-secondary-battery estimation device according to claim 3, wherein the integrator element comprises a capacitor.

8. The parameter estimation device according to claim 1, wherein the modified equivalent circuit model is free of capacitors.

9. The parameter-of-secondary-battery estimation device according to claim 2, wherein the modified equivalent circuit model is free of capacitors.

* * * * *